United States Patent
Seaba et al.

(10) Patent No.: US 6,946,113 B2
(45) Date of Patent: Sep. 20, 2005

(54) METHOD FOR PROCESSING FLUID FLOWS IN A MICRO COMPONENT REFORMER SYSTEM

(75) Inventors: James Seaba, Dublin, OH (US); Lea-Der Chen, Iowa City, IA (US)

(73) Assignee: Honda Motor Co., Ltd., Tokyo (JP)

( * ) Notice: Subject to any disclaimer, the term of this patent is extended or adjusted under 35 U.S.C. 154(b) by 39 days.

(21) Appl. No.: 10/292,069

(22) Filed: Nov. 12, 2002

(65) Prior Publication Data

US 2003/0075311 A1 Apr. 24, 2003

Related U.S. Application Data

(62) Division of application No. 09/627,267, filed on Jul. 28, 2000, now abandoned.

(51) Int. Cl.[7] .................. C01B 3/02; C01B 3/24; C01B 3/34; C01B 3/36; C01B 3/38
(52) U.S. Cl. .................. 423/648.1; 159/47.1; 165/164; 165/165; 165/166; 165/168; 423/650; 423/651; 423/652; 423/659; 429/17; 429/20
(58) Field of Search .................. 252/373; 423/648.1, 423/650, 651, 652, 653, 654, 659; 165/164, 165; 429/17, 20; 159/47.1

(56) References Cited

U.S. PATENT DOCUMENTS

| | | | |
|---|---|---|---|
| 1,601,637 A | 9/1926 | Meigs | |
| 2,576,213 A | 11/1951 | Chausson | |
| 4,777,560 A | 10/1988 | Herrell et al. | |
| 4,923,003 A | 5/1990 | Stenlund | |
| 4,985,230 A | * 1/1991 | Baden et al. | 423/659 |
| 5,811,062 A | 9/1998 | Birmingham et al. | |
| 6,059,023 A | 5/2000 | Kurematsu | |
| 6,488,838 B1 | * 12/2002 | Tonkovich et al. | 423/652 |
| 6,540,975 B2 | * 4/2003 | Tonkovich et al. | 252/373 |
| 6,616,909 B1 | * 9/2003 | Tonkovich et al. | 423/651 |
| 6,680,044 B1 | * 1/2004 | Tonkovich et al. | 423/652 |

FOREIGN PATENT DOCUMENTS

| | | |
|---|---|---|
| DE | 198 09 140 A1 | 9/1999 |
| DE | 198 25 102 A1 | 9/1999 |
| DE | 198 21 627 A1 | 11/1999 |
| GB | 1 128 018 A1 | 9/1968 |
| WO | WO 02/10660 A1 | 2/2002 |

* cited by examiner

*Primary Examiner*—Wayne A. Langel
(74) *Attorney, Agent, or Firm*—Mark E. Duell, Esq.; Porter Wright Morris & Arthur LLP

(57) ABSTRACT

A method for processing separate fluid flows in a micro component system for the production of hydrogen gas used in fuel cells in which a first fluid flow is directed to micro channels formed on one side of a conductive separator maintained in an enclosure, a second fluid flow is directed to micro channels formed on the opposite side of the separator, and laminar flow is maintained in the fluids such that heat transfer between the fluids on the opposite sides of the micro channels is by conduction through the separator and heat transfer within the fluids on the opposite sides of the micro channels is predominantly by convection within the fluids.

19 Claims, 5 Drawing Sheets

METHOD FOR PROCESSING FLUID FLOWS IN A MICRO COMPONENT REFORMER SYSTEM

RELATED UNITED STATES APPLICATION

This application is a division of U.S. application for patent Ser. No. 09/627,267 filed on Jul. 28, 2000, Multi-Purpose Micro Channel Laminar Flow Fluid Processor for Micro Component Heat Exchange and Reactor Applications (as amended), now abandoned.

FIELD OF THE INVENTION

The present invention relates to a device, structure and assembly useful as a micro-component heat exchanger and micro-chamber for the promotion of chemical reactions. The invention further relates to micro-components useful in the sequential processing or reforming of reactants involved in the production of hydrogen gas used in fuel cells and the micro-chemical processing of reactants and products.

BACKGROUND AND SUMMARY OF THE INVENTION

In the prior art, micro-component heat exchangers and cooling mechanisms have been found useful in the fields of microprocessor design where heat generated in the operation of a microprocessor is dissipated by an ancillary mechanism that provides a coolant or otherwise withdraws heat energy created as a function of electrical circuit processing from the system. Examples of such devices are described in U.S. Pat. No. 5,987,893 showing a micro cooler having micro-channels through which a coolant flows. The micro cooler includes a plurality of thin layers of metal joined in an assembly by diffusion bonding; U.S. Pat. No. 5,727,618 relating to a modular micro-channel heat exchanger for a heated region in a micro device such as a chip. A coolant enters the exchanger, absorbs heat and exits; U.S. Pat. No. 5,453,641 describes V-shaped or tapered micro-channels formed in a substrate; U.S. Pat. No. 5,002,123 also describes V-shaped micro-channels tapered in the direction of flow of fluid through the channel; U.S. Pat. No. 4,777,560 shows a heat sink formed of an integral element of thermally conductive material.

It is an object of the present invention to provide a micro-component heat exchanger assembly that facilitates the flow of gas phase and liquid phase fluids on either side of an intermediate separator or waveplate having micro-channels formed on opposite sides thereof such that energy transfer of gas phase fluids on the opposite sides of the separator is principally effected by diffusion and energy is conducted through the separator. It is a further object of the invention to provide a device in which the intermediate separator between alternate flows may include a catalyst to promote a chemical operation on the fluid passing through the device. It is yet another object to provide a micro-device having increased surface area between sections such that a micro-component reaction chamber is provided and that increased efficiency in the transfer of heat energy by diffusion is achieved.

The invention is described more fully in the following description of the preferred embodiment considered in view of the drawings in which:

DETAILED DESCRIPTION OF THE INVENTION AND THE PREFERRED EMBODIMENT

Figure 1A:
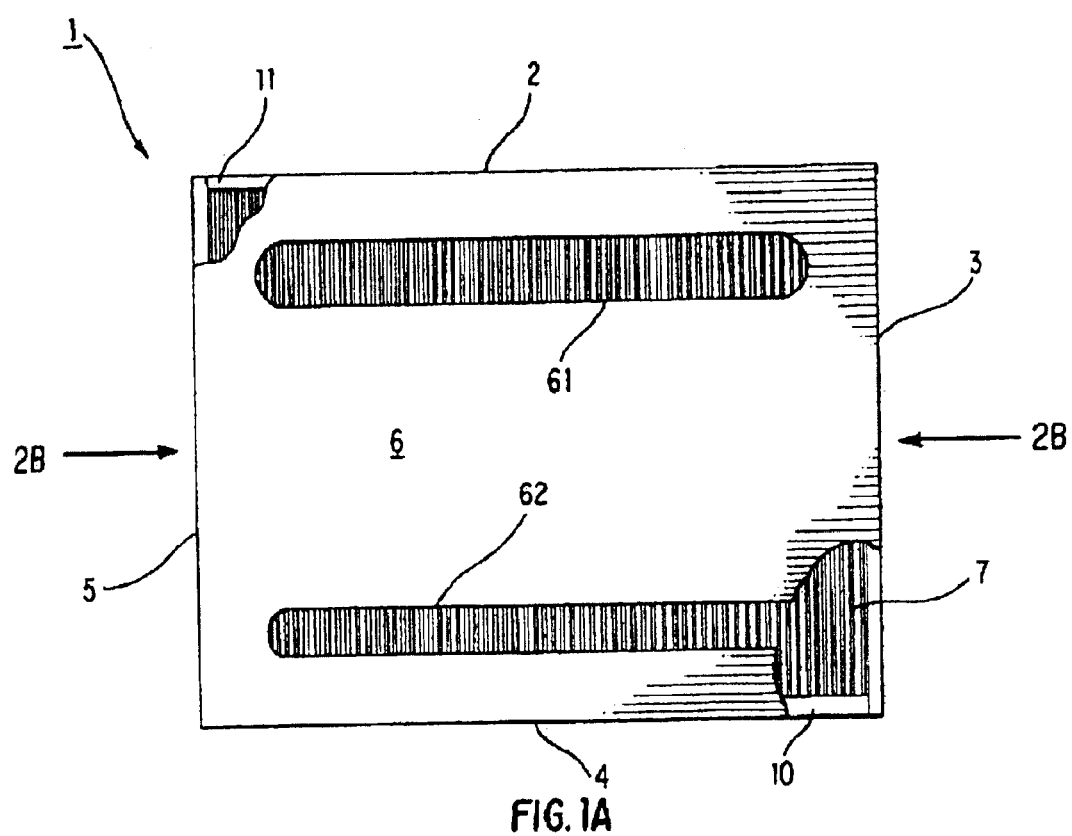
FIG. 1A and FIG. 1B are respectively cut away plan and cut away side views of the micro-channel device.

In brief, the invention is a micro-component assembly useful as a heat exchanger or chemical reaction chamber comprising a thin zigzag, wave shaped or other alternatingly folded formed separator that forms adjacent and longitudinally extending micro-channels on opposite sides thereof for gas phase or liquid phase fluid flow. The separator is preferably a metal lamina formed in a zigzag cross-section and may comprise alternately directed folds or waves in a unitary member. In cross-section, the separator may be approximately sinusoidal in shape, bearing in mind that the separator is formed from a thin sheet material and is subject to variations in the forming/manufacturing process. In a laminated structure, the separator is a middle element in a sealed or laminated enclosure having longitudinally separate laterally extending inlet and outlet openings transverse to the channels allowing the flow of fluid through the channels.

In its variations, the device is a micro-component heat exchanger in which the separator forms adjacent and longitudinally extending micro-channels for the flow of separate fluids between which heat is exchanged. As a micro-component reaction chamber the separator may include thereon a catalyst composition to promote a chemical reaction in the fluid flowing in the channels formed therein. In a multiple function application, separate endothermic and exothermic reactions may be promoted at the opposite surfaces of the micro-channels formed by the separator.

In its fabrication, one of an upper or lower section and two opposite side sections of a rectangular enclosure may be integrally formed from a "U" shaped channel section; the two additional side sections of the enclosure are formed from side plates.

As a micro-component heat exchanger or reaction chamber, the device is formed as a laminate including upper, lower and side members enclosing a middle sheet separator formed or stamped in a zigzag or wave shape that separates the device into two arrays of longitudinally separate side by side channel sections for the flow of separate fluids through respective sides of the device. The middle separator sheet may include, such as by a coating, a catalyst to promote a chemical reaction by a fluid passing therethrough or a surface treatment that increases surface area or enhances reactions. In this manner, the device is useful as a micro-component reaction chamber that provides increased surface area on which a reactant may react with, for example, a catalyst as the reagent passes through the micro-channel.

The device is shown in the drawings and includes a top sheet, bottom sheet and a middle sheet between the top and bottom sheets that separates the device into two adjacent channels for the flow of fluids. The middle sheet is preferably formed or stamped in a zigzag, folded, wave, or corrugated pattern to promote the longitudinal side-by-side flow of separate fluids on opposite sides thereof through the device. The middle sheet may be coated with a catalyst to promote a chemical reaction in a fluid passing therethrough, or chemically or otherwise treated to enhance the surface area with which the fluid interacts. When used as a micro-reaction chamber, the folded pattern, by itself, of the middle sheet with a catalyst coating thereon increases the available surface area for reagents to react with the catalyst.

Figure 1B:
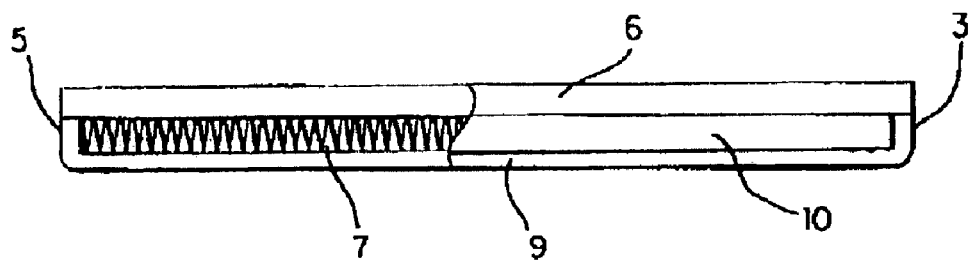
Figure 1C:
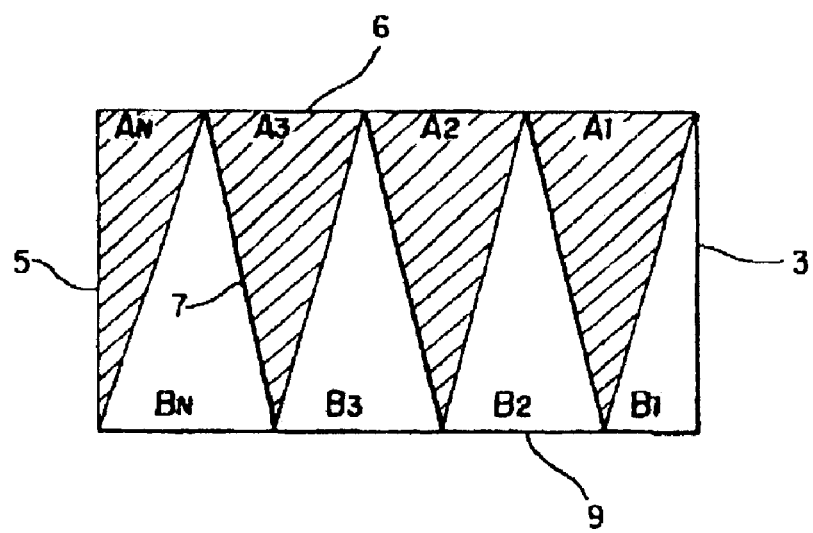
FIG. 1C is a cross-sectional representation of a micro-channel device.
Figure 4:
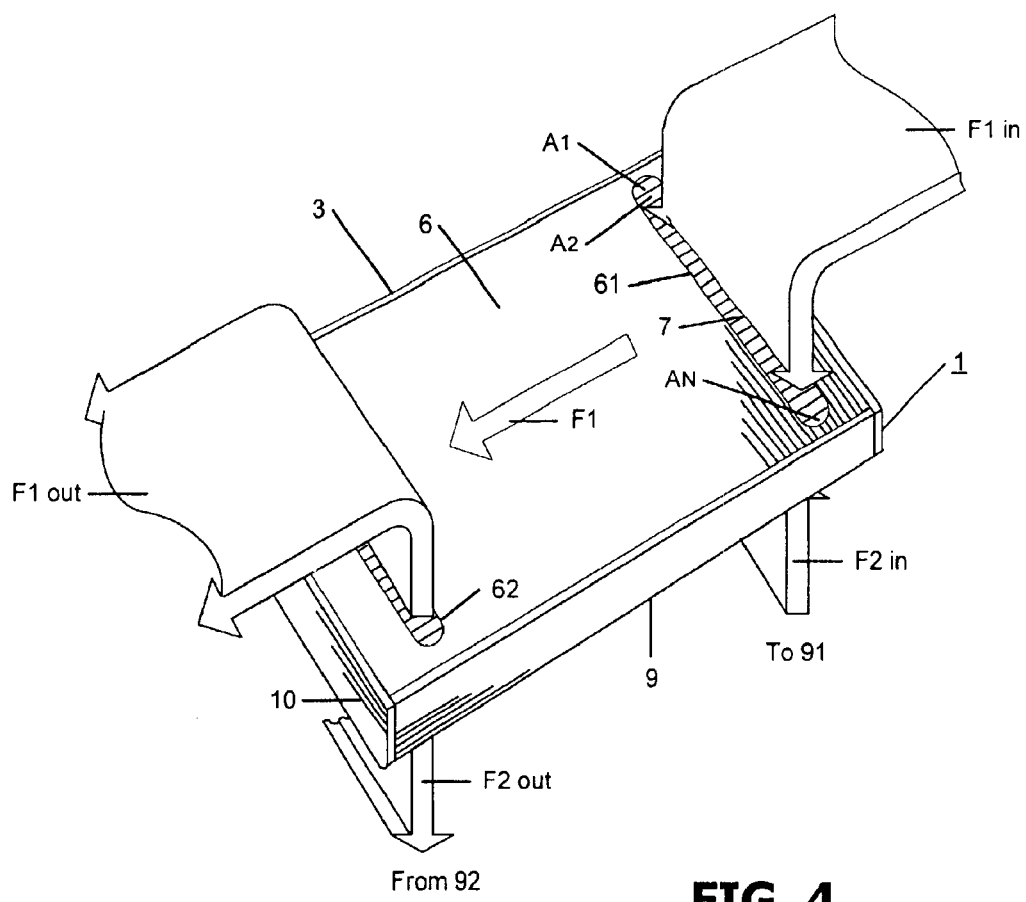
FIG. 4 shows fluid flow through the device.

With reference to FIG. 1A, the device 1 is shown in plan view with perimeter sides 2, 3, 4, and 5 and upper plate section 6 and lower plate section 9 forming an enclosure for micro-channel separator 7 which is sandwiched between the upper and lower plates. Inlet and outlet openings 61 and 62 are shown formed into upper section 6. FIG. 1B shows a side cross section depicting a "U" shaped channel member forming opposite sides 3 and 5 and the lower plate section 9. When such a "U" channel is used, separate end plates such as shown at 10 and 11 at sides 2 and 4 complete the perimeter enclosure of the device. The micro-channels are shown figuratively in FIG. 1C in which an enclosure for the device is shown formed by sides 3, 5, 6 and 9 and the middle lamina is shown at 7 dividing the assembly into micro-channels A1, A2, A3 ... $A_N$ on one side and micro-channels B1, B2, B3 ... $B_N$ on the opposite side of the middle separator. A first fluid flow is directed through an inlet and outlet on one side through micro-channels A1, A2, A3 ... $A_N$; a second fluid flow is directed on the other side through an inlet and outlet to micro-channels B1, B2, B3 ... $B_N$. With reference to FIG. 4 showing fluid flow through the device, a first fluid flow F1 is directed on one side through inlet 61 to outlet 62 through micro-channels A1, A2, A3 ... $A_N$ formed by the separator 7; a second fluid flow F2 is directed on the other side through inlet 91 to outlet 92 to micro-channels B1, B2, B3 ... $B_N$ (not shown) formed by separator 7.

Figure 2A:
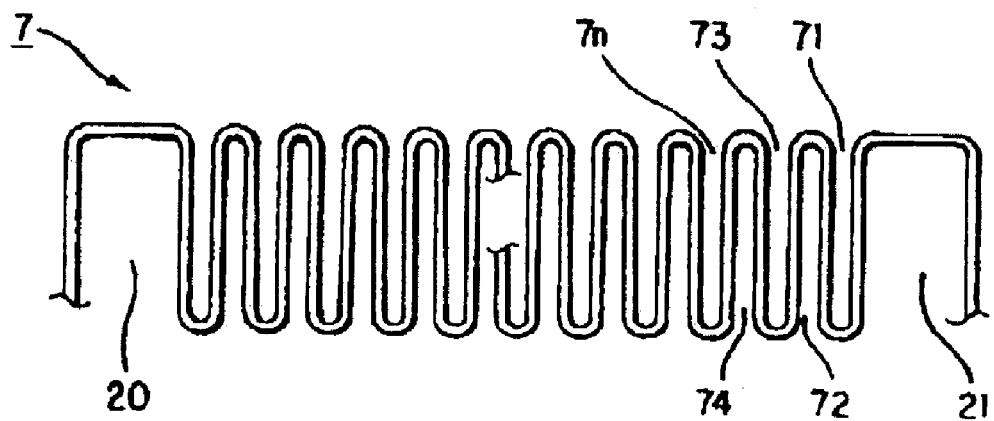
FIG. 2A and FIG. 2B show a cross-sectional detail views of the micro-channel assembly.
Figure 2B:
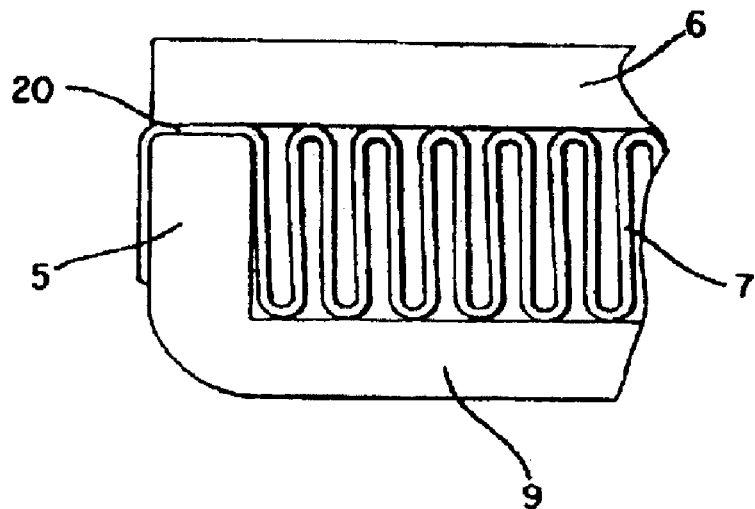

FIG. 2A shows the middle sheet or separator 7 forming the alternating micro-channels 71, 72, 73, 74, 7n ... on the opposite sides of the folded sheet or waveplate. The micro-channels are formed in a wave or zigzag cross section pattern in the central section of a plate having side flanges 20 and 21 that overlap side edges 5 and 3 extending from the lower plate section 9 to form a "U" base member. The separator is an integrally formed folded array of a conductive material laminated between the upper and lower plates with brazed contact points sealing the separator between side edges 5 and 3 and shoulder flanges 20 and 21. The seal between the side edges and flanges separates fluid flow on the opposite sides of the separator. The entire assembly including side plates 10 and 11 and top plate 6 is preferably brazed together. Brazing is preferred over diffusion bonding of the components because brazing is effected at a lower temperature and brazing does not require the addition of pressure to bond adjacent member surfaces. (Brazing is the preferred method of bonding the components. Diffusion bonding which requires a higher temperature than brazing may be useful for devices having, in certain applications, different temperature and durability requirements.)

Figure 3A:
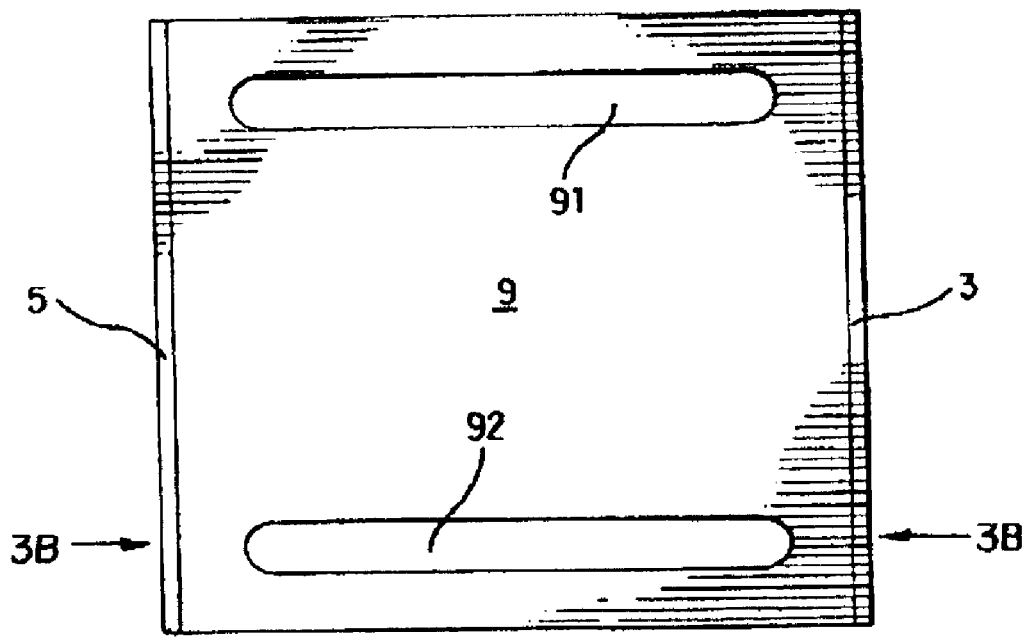
FIG. 3A and FIG. 3B are respectively plan and cross section views of the lower, or bottom, component of the micro-channel device assembly.
Figure 3B:
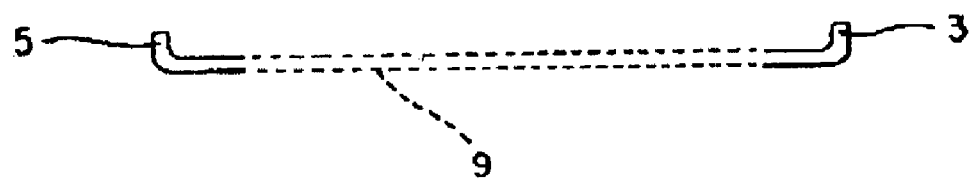

FIG. 3A is a plan view of the "U" channel base member; FIG. 3B shows the member in cross section. The lower plate section 9 also includes separated inlet and outlet openings 91 and 92 leading to and from the array of micro-channels formed by the separator waveplate. In a completed assembly, the opposite surface areas of the separator 7 on the side facing the upper section 6 and on the side facing the lower section 9 allow the exchange of heat energy by conduction through the separator. Fluid flows from inlet 61 to outlet 62 on one side and from inlet 91 to outlet 92 on the opposite side of the device. Flow direction is arbitrarily determined by the use and intended application of the device. In the preferred embodiment, gas phase heat is exchanged between fluids and the separator predominantly by diffusion. Heat is exchanged between the two fluids on the opposite sides by conduction through the separator. In conventional macro-scaled channeled heat exchangers, turbulent flow occurs through the channels and heat transfer is effected by convection with the separator wall and conduction through the separator wall to the second fluid. In the micro-channels of the present invention, laminar flow through the micro-channels occurs in both gas phase or liquid phase flow; in gas phase flow, heat transfer from the fluid to the separator is predominantly by diffusion; in liquid phase flow, heat transfer from the fluid to the separator is by conduction. In both instances, heat transfer through the separator is by conduction.

In an example, the device is formed of metal alloy; all components of the assembly are brazed together and tested under pressure, inter alia, to verify the seal separating the micro-channels on the opposite sides. The device must withstand high operating temperatures, such as in the order of 900° C. Dimensions are dependent on the reaction and heat transfer requirements of a particular micro-component application. In general, length is determined to optimize pressure drop in laminar flow through the micro-channels with regard to residence time and heat transport required by an application. Width is determined by overall capacity requirements. A minimum thickness is an optimization objective, but is subject to mechanical durability considerations. For typical micro-processing applications, typical dimensions of the micro-devices include an overall thickness in the range of approximately 1.0 millimeters to approximately 20.0 millimeters, an overall length in the range of approximately 10.0 millimeters to approximately 300.0 millimeters, and an overall width in the range of approximately 10.0 millimeters to approximately 100.0 millimeters depending on application requirements. The middle separator or waveplate is formed from a metal alloy material of a thickness in the range of approximately 0.01 millimeters to approximately 1.0 millimeters and includes channel separations of in the range of approximately 0.01 millimeters to approximately 1.0 millimeters between adjacent peaks with nominal fold radii up to approximately 0.5 millimeters. In a wave shape, a radius for wave peaks and troughs in the range of approximately 0.005 millimeters approaches a minimum. Suitable materials for forming the middle waveplate separator include stainless steels and alloys thereof, nickel alloys such as inconel, and steel metals that include chromium, nickel and other additives. In an example, an Inconel alloy, a category of low co-efficient of expansion steels with high nickel content that are stable at high temperatures, formed the separator. BNi-2 is a suitable brazing material used to bond the separator to the sidewalls. BNi-2 is a combination of iron, boron, chromium and silicon with a balance of nickel.

In summary, the device is a micro-component useful as a heat exchanger or chemical reaction chamber comprising a separator forming on opposite sides thereof adjacent and longitudinally extending micro-channels for fluid flow. The separator may be a conductive middle element in a sealed enclosure having inlet and outlet openings transverse to the channels allowing the flow of fluid through the channels. The same assembly is useful for multiple purposes. A single design may be adapted to different applications: a heat exchanger, a reaction chamber and a vaporization chamber. The micro-channel device may be used to exchange heat between gases, between liquids, and between a gas and a liquid flowing on opposite sides of the micro-channels. As a reaction chamber the micro-channel walls of the separator may include a catalyst or promoter to induce a predetermined reaction in fluid flowing in the micro-channels in contact therewith. As a vaporization chamber, heat from a fluid flowing on one side transferred through the separator will promote a phase change in a fluid on the other side from an introduced liquid to an exiting gas.

Having described the invention in detail, those skilled in the art will appreciate that, given the present disclosure, modifications may be made to the invention without departing from the spirit of the inventive concept herein described. Therefore, it is not intended that the scope of the invention be limited to the specific and preferred embodiments illustrated and described. Rather, it is intended that the scope of the invention be determined by the appended claims.

What is claimed is:

1. In a method for processing fluid flows in a system for the production of hydrogen gas used in fuel cells, the improvement comprising separating a first fluid flow into multiple paths flowing through a plurality of open micro channels formed on one side of a wave shaped conductive separator in a sealed micro component to maintain the multiple separate flow paths of fluid on one side of the separator in an alternating side by side relationship with multiple separate flow paths of fluid on the other side of the separator, separating a second fluid flow into multiple paths flowing through a plurality of open micro channels formed on the opposite side of the wave shaped conductive separator maintained in the sealed micro component, and maintaining laminar flow in the fluids such that heat transfer between the fluids on the opposite sides of the micro channels is by conduction through the separator and heat transfer within the fluids on the opposite sides of the micro channels is predominantly by convection within the fluid.

2. In a method for exchanging heat between separate fluid flows in a system for the production of hydrogen gas used in fuel cells, the improvement comprising separating a first fluid flow into multiple paths flowing through a plurality of open micro channels formed on one side of a wave shaped conductive separator in a sealed micro component to maintain the multiple separate flow paths of fluid on one side of the separator in an alternating side by side relationship with multiple separate flow paths of fluid on the other side of the separator, separating a second fluid flow into multiple paths flowing through a plurality of open micro channels formed on the opposite side of the conductive separator maintained in the sealed micro component, and maintaining laminar flow in the fluids such that heat transfer between the fluids on the opposite sides of the micro channels is by conduction through the separator and heat transfer within the fluids on the opposite sides of the micro channels is predominantly by convection within the fluid.

3. A method for effecting a chemical reaction in one or more separate fluid flows in a system for the of hydrogen gas used in fuel cells comprising separating a first fluid flow into multiple paths flowing through a plurality of open micro channels formed on one side of a wave shaped conductive separator in a sealed micro component to maintain the multiple separate flow paths of fluid on one side of the separator in an alternating side by side relationship with multiple separate flow paths of fluid on the other side of the separator, separating a second fluid flow into multiple paths flowing through a plurality of open micro channels formed on the opposite side of the conductive separator maintained in the sealed micro component, and maintaining laminar flow in the fluids such that heat transfer between the fluids on the opposite sides of the micro channels is by conduction through the separator and heat transfer within the fluids on the opposite sides of the micro channels is predominantly by convection within the fluid.

4. In a method for reforming reactants in a system for the production of hydrogen gas used in fuel cells, the improvement comprising separating the flow of one or more than one reactant in the reforming process respectively into multiple paths flowing through a plurality of open micro channels formed on opposite sides of a wave shaped conductive separator in a sealed micro component to maintain the multiple separate flow paths of fluid on one side of the separator in an alternating side by side relationship with multiple separate flow paths of fluid on the other side of the separator, and maintaining laminar flow in the fluids such that heat transfer between the fluids on the opposite sides of the channels is by conduction through the separator and heat transfer within the fluids on the opposite sides of the channels is predominantly by convection within the fluids.

5. The method of claim 3 or claim 4 in which a fluid flow directed to the micro channels is subjected to the activity of a catalyst coating included on the inside surface of the micro channels on at least one side of the separator.

6. The method of claim 1 or claim 2 or claim 3 or claim 4 in which the fluids are directed to micro channels having a nominal peak to peak width in the range of approximately 0.01 millimeters to approximately 1.0 millimeters.

7. The method of claim 6 including directing fluid flows into micro channels formed by a separator having a thickness in the range of approximately 0.01 millimeters to approximately 1.0 millimeters formed from a thermally conductive material.

8. The method of claim 7 in which the thermally conductive material is a metal alloy including at least one of a nickel component and a chromium component.

9. The method of claim 6 in which fluid flows are directed to side by side micro channels defined by a wave shaped folded sheet separator.

10. In a system for producing hydrogen gas used in fuel cells, a method for exchanging heat between separate fluid flows introduced into a micro component enclosure comprising:

directing a first fluid flow to an inlet opening in the enclosure disposed transverse to a plurality of adjacent and longitudinally extending micro channels formed by a metal sheet separator in the enclosure, the separator being shaped into a wave form having alternating apexes forming parallel and longitudinally extending side by side open micro channels on opposite surfaces of the separator in a correspondence with the wave form and maintaining laminar flow in the first fluid flow through the micro channels to an outlet opening longitudinally spaced apart from the inlet opening and disposed transverse to the plurality of micro channels, directing a second fluid flow to an inlet opening in the enclosure disposed on the opposite side of the separator into the open micro channels formed thereby and maintaining laminar flow in the second fluid flow through the micro channels to an outlet opening longitudinally spaced apart from the inlet opening and disposed transverse to the plurality of the micro channels on the opposite side, and minimizing the pressure drop in the fluids flowing on the opposite sides of the micro channels, such that energy transfer with respect to a fluid on one side of the separator to a fluid on the other side of the separator is predominantly effected by conduction through the separator as a result of the alternating side by side relationship of the open micro channels and by convection within the fluids with respect to the fluid flows on the one and the other side of the separator.

11. The system of claim 10 including subjecting at least one of the fluid flows to a catalyst coating included on the micro channels to promote a chemical reaction.

12. The system of claim 10 for vaporizing a liquid in which a flow of a first heated fluid is directed through the micro channels from the inlet opening to the outlet opening on one side and, on the opposite side, a liquid phase of a second fluid is directed into the inlet opening and flows through the micro channels such that the physical state of the fluid, as the fluid passes through the micro channels to the outlet opening, transforms to a gas phase.

13. A system for micro processing separate fluid flows in accordance with claim 10 in which fluids are directed to a sealed micro component having a volume defined by a thickness in the range of approximately 1.0 millimeters to approximately 20.0 millimeters, a length in the range of approximately 10.0 millimeters to approximately 100.0 millimeters, and a width in the range of approximately 10.0 millimeters to approximately 300.0 millimeters and the micro channels are defined by a wave shaped separator sealed within the enclosure having dimensions corresponding the interior of the enclosure and the micro channels are defined by wave shaped folds in the separator in which nominal separations between sides of adjacent folds in the sheet are in the range of approximately 0.01 millimeters to approximately 1.0 millimeters and the longitudinal side edges of the separator are bonded to the longitudinal side edges at each side of the enclosure.

14. The method of claim 1 or claim 2 or claim 3 or claim 4 in which the micro channels have a width to height aspect ratio in the range of about 1 to 10 to about 1 to 200.

15. A method for vaporizing a liquid in a micro component system for producing hydrogen gas used in a fuel cell comprising (1) separating a first flow of liquid into multiple paths flowing through a plurality of open micro channels formed on one side of a wave shaped thermally conductive separator, wherein the wave shape is characterized by a width to height aspect ratio in the range of about 1 to 10 to about 1 to 200, in a sealed micro component which maintains the multiple paths of fluid flow on one side of the separator in an alternating side by side relationship with multiple separate flow paths of a second flow of heated gas that is separated into the micro channels on the opposite side of the separator; (2) introducing the second flow of heated gas into the micro channels on the apposite side of the separator; (3) and maintaining laminar flow in the liquid and gas flow through the side by side micro channels such that heat is transferred by convection within the gas and by conduction through the separator from the heated gas on the opposite side to the liquid on the one side, whereby the flow of liquid is heated and vaporized in the course of flow through the micro channels on the one side.

16. The method of claim 15 in which the fluids are directed to micro channels having a nominal peak to peak width in the range of approximately 0.01 millimeters to approximately 1.0 millimeters.

17. The method of claim 15 including directing fluid flows into micro channels formed by a separator having a thickness in the range of approximately 0.01 millimeters to approximately 1.0 millimeters.

18. The method of claim 15 in which the separator is formed from a thermally conductive metal alloy including at least one of a nickel component and a chromium component.

19. The method of claim 15 in which fluid flows are directed to side by side micro channels defined by a folded sheet separator.

* * * * *